United States Patent
Lee et al.

(10) Patent No.: US 11,776,975 B2
(45) Date of Patent: Oct. 3, 2023

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Jui-Hung Hsu, Hsin-Chu County (TW); Ya-Han Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 120 days.

(21) Appl. No.: 17/468,824

(22) Filed: Sep. 8, 2021

(65) Prior Publication Data

US 2022/0328547 A1 Oct. 13, 2022

(30) Foreign Application Priority Data

Apr. 12, 2021 (TW) .................................. 110113032

(51) Int. Cl.
*H01L 27/146* (2006.01)
(52) U.S. Cl.
CPC .. *H01L 27/14618* (2013.01); *H01L 27/14625* (2013.01); *H01L 27/14636* (2013.01)
(58) Field of Classification Search
CPC ......... H01L 27/14618; H01L 27/14625; H01L 27/14636; H01L 23/3114; H01L 23/3121; H01L 27/14634
See application file for complete search history.

(56) References Cited

U.S. PATENT DOCUMENTS

| 9,905,597 | B2* | 2/2018 | Yang | H01L 33/483 |
| 2015/0011038 | A1* | 1/2015 | Huang | H01L 27/14618 |
| | | | | 438/66 |
| 2018/0012920 | A1* | 1/2018 | Tu | H01L 27/14636 |
| 2019/0057952 | A1* | 2/2019 | Chen | H01L 24/29 |
| 2019/0393113 | A1* | 12/2019 | Chen | H01L 27/14625 |

* cited by examiner

*Primary Examiner* — Jonathan Han

(74) *Attorney, Agent, or Firm* — Li & Cai Intellectual Property (USA) Office

(57) ABSTRACT

A sensor package structure is provided and includes a substrate, a sensor chip disposed on the substrate, a plurality of wires electrically coupled to the substrate and the sensor chip, a light-permeable layer, and a colloid formed on the substrate to fix the light-permeable layer. The colloid covers the wires, a peripheral portion of the sensor chip, and lateral surfaces of the light-permeable layer. A top curved surface of the colloid is partially arranged beside the lateral surfaces. In a cross section of the sensor package structure, the top curved surface has a reference point spaced apart from one of the lateral surfaces adjacent thereto by 100 μm, a top edge of the top curved surface and the reference point define a connection line, and the connection line and the one of the lateral surfaces have an acute angle within a range from 25 degrees to 36 degrees.

10 Claims, 4 Drawing Sheets

SENSOR PACKAGE STRUCTURE

CROSS-REFERENCE TO RELATED PATENT APPLICATION

This application claims the benefit of priority to Taiwan Patent Application No. 110113032, filed on Apr. 12, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a glass layer and a package body that covers lateral sides of the glass layer, and the glass layer can be fixed by the package body. Accordingly, in the conventional sensor package structure, the volume of the package body formed on the lateral sides of the glass layer cannot be too small, so as to enable the glass layer to be firmly fixed. However, the conventional sensor package structure is provided without recognizing that when the volume of the package body formed on the lateral sides of the glass layer is too large, cracks can easily be formed on the glass layer of the conventional sensor package structure as a result of thermal expansion and contraction of the package body.

SUMMARY OF THE DISCLOSURE

In response to the above-referenced technical inadequacy, the present disclosure provides a sensor package structure to effectively improve on the issues associated with conventional sensor package structures.

In one aspect, the present disclosure provides a sensor package structure, which includes a substrate, a sensor chip, a plurality of wires, a light-permeable layer, and a colloid. The substrate has a first surface and a second surface that is opposite to the first surface. The sensor chip is disposed on the first surface of the substrate. The wires are electrically coupled to the sensor chip and the substrate. Two ends of each of the wires are respectively connected to the first surface of the substrate and an upper surface of the sensor chip. The light-permeable layer is arranged above the sensor chip and has a top surface, a bottom surface, and a plurality of lateral surfaces that are connected to the top surface and the bottom surface. The bottom surface of the light-permeable layer faces toward the upper surface of the sensor chip. The colloid is formed on the first surface of the substrate to fix the light-permeable layer. The wires and a peripheral portion of the sensor chip are embedded in the colloid, the lateral surfaces of the light-permeable layer are covered by the colloid, and the top surface of the light-permeable layer is exposed from the colloid. Moreover, a portion of a top curved surface of the colloid is arranged in a space defined by virtually extending the lateral surfaces of the light-permeable layer along a distribution direction parallel to the substrate. In a cross section of the sensor package structure perpendicular to the distribution direction, the top curved surface has a reference point spaced apart from one of the lateral surfaces adjacent thereto by 100 μm, a top edge of the top curved surface and the reference point jointly define a connection line, and the connection line and the one of the lateral surfaces have an acute angle there-between that is within a range from 25 degrees to 36 degrees.

Therefore, the sensor package structure in the present disclosure is provided by controlling a structural configuration between the top curved surface of the colloid and the light-permeable layer (e.g., the top curved surface of the colloid is partially arranged in the space defined by virtually extending the lateral surfaces of the light-permeable layer along the distribution direction parallel to the substrate, and the acute angle between the connection line and the one of the lateral surfaces is within a range from 25 degrees to 36 degrees), so that the volume of the colloid arranged beside the light-permeable layer can be effectively controlled, the light-permeable layer of the sensor package structure can be firmly fixed by the colloid, and an effect on the light-permeable layer resulting from thermal expansion and contraction of the colloid can be effectively reduced. Accordingly, the light-permeable layer of the sensor package structure in the present disclosure does not easily crack as a result of the thermal expansion and contraction of the colloid.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
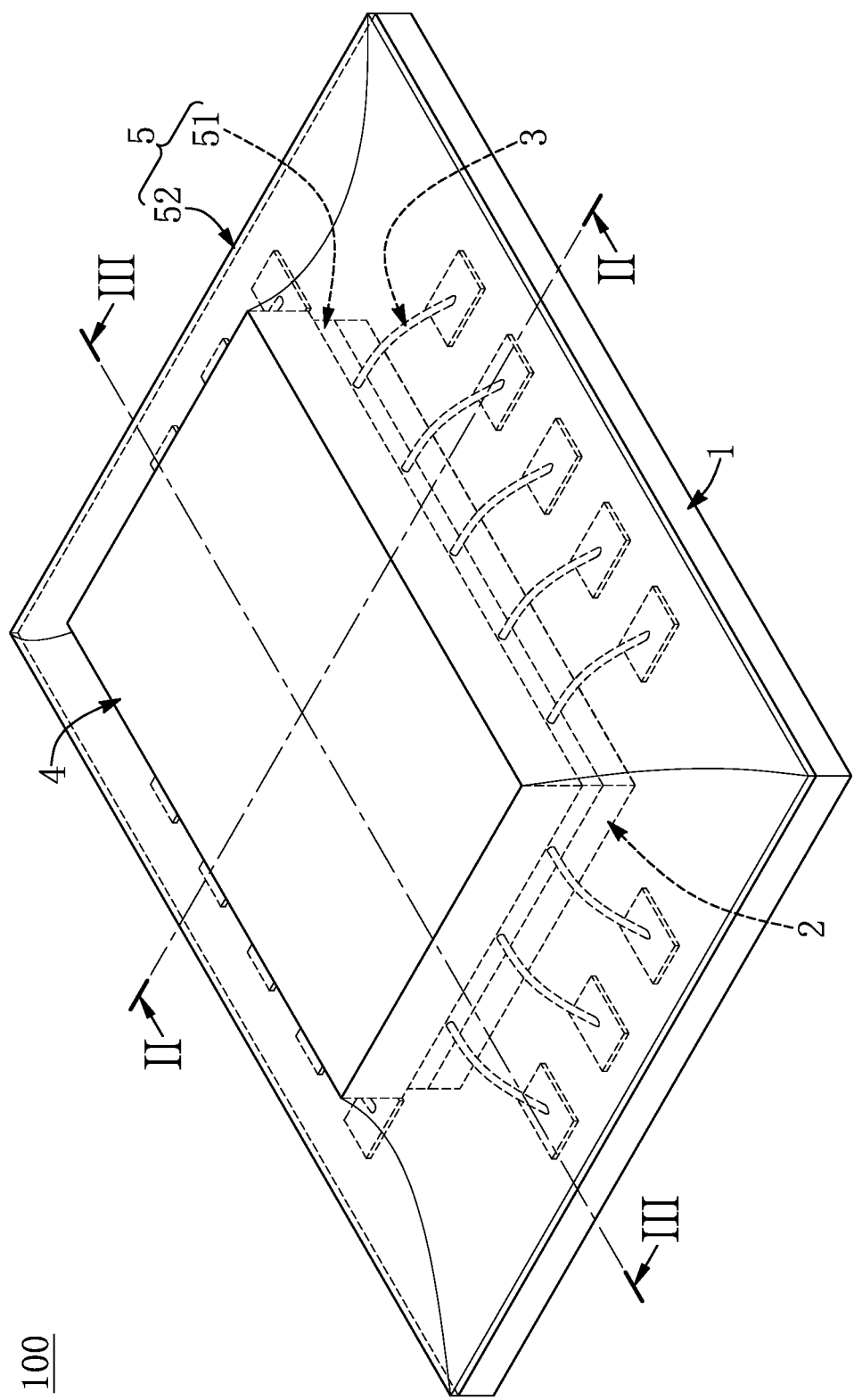
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
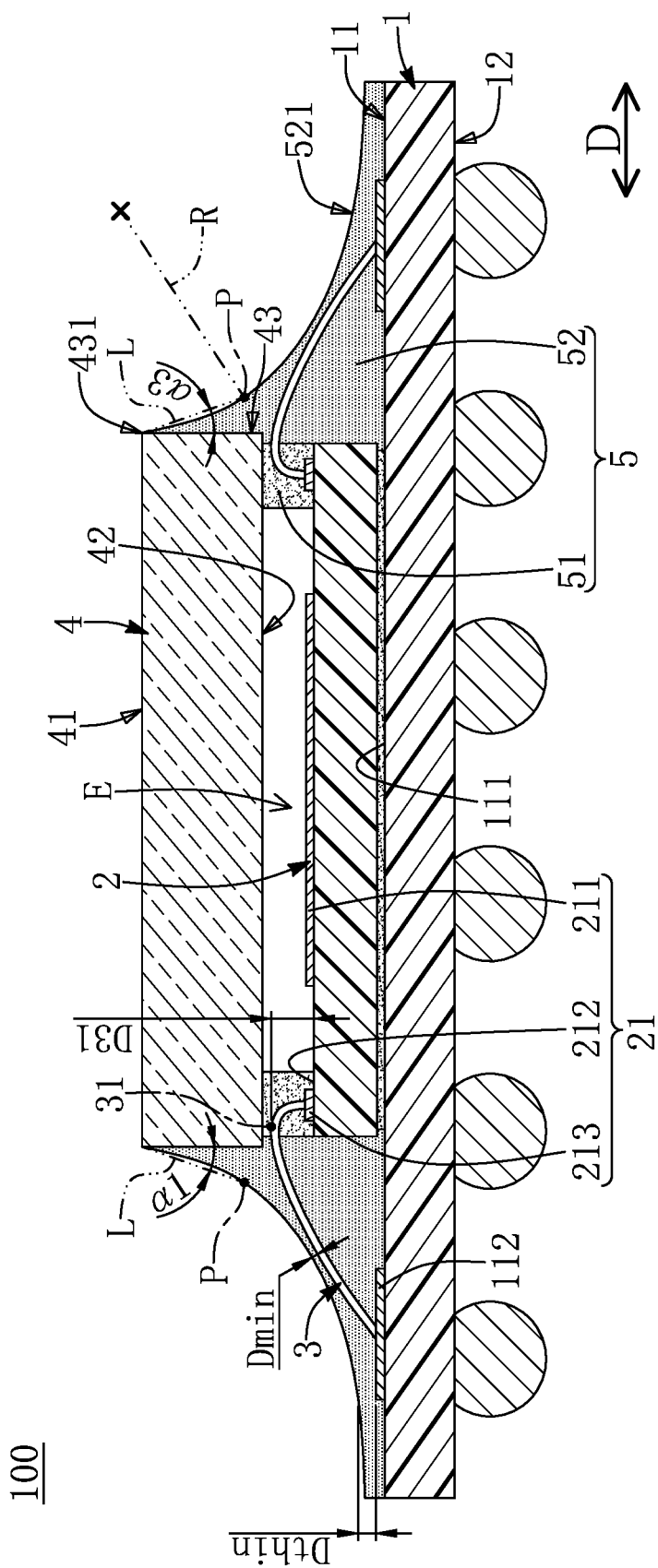
FIG. 2 is a cross-sectional view taken along line II-II of FIG. 1.
Figure 3:
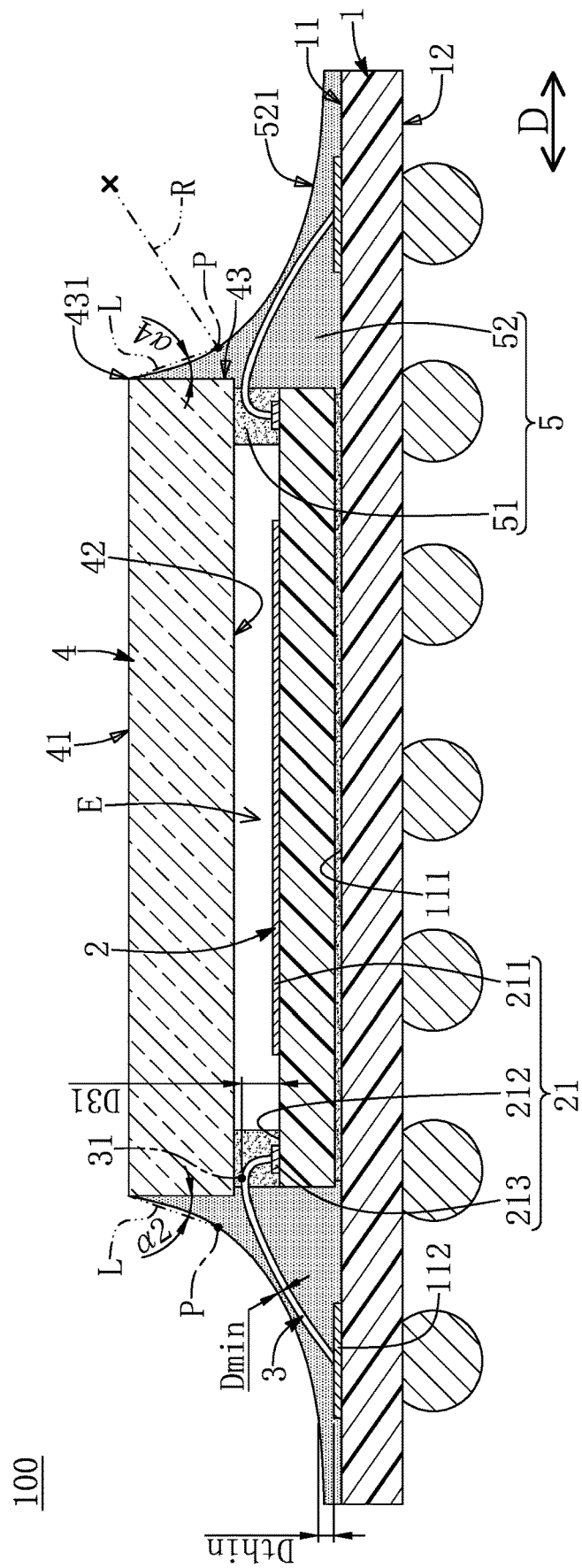
FIG. 3 is a cross-sectional view taken along line III-III of FIG. 1.

Referring to FIG. 1 to FIG. 3, a first embodiment of the present disclosure provides a sensor package structure 100. The sensor package structure 100 in the present embodiment includes a substrate 1, a sensor chip 2 disposed on the substrate 1, a plurality of wires 3 electrically coupled to the sensor chip 2 and the substrate 1, a light-permeable layer 4 arranged above the sensor chip 2, and a colloid 5 that is formed on the substrate 1 to fix the light-permeable layer 4. The sensor package structure 100 in the present embodiment is limited to be provided including the light permeable layer 4 that does not have any cracks after the sensor package structure 100 goes through a thermal cycling test according to condition B of the JEDEC standards, but the present disclosure is not limited thereto.

Moreover, the sensor package structure 100 in the present embodiment includes the above components, but can be adjusted or changed according to design requirements. For example, in other embodiments of the present disclosure not shown in the drawings, the sensor package structure 100 can be provided without the wires 3, and the sensor chip 2 can be fixed onto the substrate 1 in a flip-chip manner.

It should be noted that FIG. 2 and FIG. 3 are cross-sectional views for the sake of easily describing the sensor package structure 100 of the present embodiment, and portions of the sensor package structure 100 not shown in FIG. 2 and FIG. 3 shall have corresponding structures. For example, FIG. 2 shows only two of the wires 3, but portions of the sensor package structure 100 not shown in FIG. 2 include other wires 3. The structural and connection relationship of each component of the sensor package structure 100 are described in the following description.

The substrate 1 of the present embodiment is in a square shape or a rectangular shape, but the present disclosure is not limited thereto. The substrate 1 has a first surface 11 and a second surface 12 that is opposite to the first surface 11. The substrate 1 includes a chip-bonding region 111 arranged approximately on a center portion of the first surface 11, and includes a plurality of first pads 112 that are arranged on the first surface 11 and that are arranged outside of the chip-bonding region 111. The first pads 112 in the present embodiment are substantially in an annular arrangement, but the present disclosure is not limited thereto. For example, in other embodiments of the present disclosure not shown in the drawings, the first pads 112 can be arranged in two rows at two opposite sides of the chip-bonding region 111, respectively.

In addition, the substrate 1 can be further provided with a plurality of soldering balls (not labeled in the drawings) disposed on the second surface 12. The substrate 1 can be soldered onto an electronic component (not shown in the drawings) through the soldering balls, thereby electrically connecting the sensor package structure 100 to the electronic component.

The sensor chip 2 in the present embodiment is an image sensing chip, but the present disclosure is not limited thereto. The sensor chip 2 is fixed onto the first surface 11 of the substrate 1 (e.g., the chip-bonding region 111). In other words, the sensor chip 2 is arranged to be surrounded by the first pads 112. Moreover, an upper surface 21 of the sensor chip 2 has a sensing region 211, a carrying region 212 having an annular shape arranged around the sensing region 211, and a plurality of second pads 213 that are arranged outside of the sensing region 211. In the present embodiment, the second pads 213 are disposed on the carrying region 212.

Moreover, positions and a quantity of the second pads 213 of the sensor chip 2 in the present embodiment correspond to those of the first pads 112 of the substrate 1. Two ends of each of the wires 3 are respectively connected to the first surface 11 of the substrate 1 and the upper surface 21 of the sensor chip 2. Specifically, one of the two ends of each of the wires 3 are respectively connected to the first pads 112, and the other one of the two ends of each of the wires 3 are respectively connected to the second pads 213, so that the substrate 1 and the sensor chip 2 can be electrically connected to each other through the wires 3.

In addition, each of the wires 3 has a highest point 31 arranged away from the first surface 11, and the highest point 31 of each of the wires 3 is located directly above the upper surface 21 of the sensor chip 2, but the present disclosure is not limited thereto. Specifically, the highest point 31 of each of the wires 3 is spaced apart from the upper surface 21 of the sensor chip 2 by a distance D31 that is less than or equal to 80 μm. It should be noted that the wire 3 in the present embodiment is formed in a normal bond manner, but in other embodiments of the present disclosure not shown in the drawings, the wire 3 can be formed in other manners (e.g., a reverse bond manner).

The light-permeable layer 4 in the present embodiment is a transparent and flat glass board, but the present disclosure is not limited thereto. The light-permeable layer 4 is fixed by the colloid 5 so as to be arranged above the sensor chip 2. The light-permeable layer 4 includes a top surface 41, a bottom surface 42, and a plurality of lateral surfaces 43 connected to the top surface 41 and the bottom surface 42. The bottom surface 42 of the light-permeable layer 4 faces toward the sensing region 211 (or the upper surface 21) of the sensor chip 2. The top surface 41 of the light-permeable layer 4 in the present embodiment is perpendicularly connected to each of the lateral surfaces 43, and each of the lateral surfaces 43 has an edge 431 connected to the top surface 41 of the light-permeable layer 4, but the present disclosure is not limited thereto.

The colloid 5 is formed on the first surface 11 of the substrate 1, and the wires 3 and a peripheral portion of the sensor chip 2 (e.g., a portion of the sensor chip 2 corresponding in position to the second pads 213) are embedded in the colloid 5. The lateral surfaces 43 of the light-permeable layer 4 are covered by the colloid 5, and the top surface 41 of the light-permeable layer 4 is exposed from the colloid 5.

Moreover, a top edge of the top curved surface 521 of the colloid 5 is connected to the edges 431 of the lateral surfaces 43 of the light-permeable layer 4, and a portion of the top curved surface 521 of the colloid 5 is arranged in a space defined by virtually extending the lateral surfaces 43 of the light-permeable layer 4 along a distribution direction D (e.g., a horizontal plane) parallel to the substrate 1 (e.g., an area of the portion of the top curved surface 521 of the colloid 5 is 72% to 95% of an area of the top curved surface 521). Accordingly, since the sensor package structure 100 of the present embodiment is formed in the above structural configuration, the volume of the colloid 5 arranged beside the light-permeable layer 4 can be smaller for effectively reducing an effect on the light-permeable layer 4 resulting from the thermal expansion and contraction of the colloid 5.

Specifically, in a cross section of the sensor package structure 100 perpendicular to the distribution direction D, the top curved surface 521 has a reference point P spaced apart from one of the lateral surfaces 43 adjacent thereto by 100 μm, the top edge of the top curved surface 521 and the reference point P jointly define a connection line L, and the connection line L and the one of the lateral surfaces 43 have an acute angle α1, α2, α3, or α4 there-between that is within a range from 25 degrees to 36 degrees. Accordingly, the volume of the colloid 5 arranged beside the light-permeable layer 4 can be effectively controlled by the above condition, so that the light-permeable layer 4 of the sensor package structure 100 can be firmly fixed by the colloid 5, and the effect on the light-permeable layer 4 resulting from the thermal expansion and contraction of the colloid 5 can be effectively reduced.

Moreover, in order to preferably implement the fixing effect of the light-permeable layer 4 by the colloid 5 and in order to reduce the effect on the light-permeable layer 4 and the wires 3 resulting from the thermal expansion and contraction of the colloid 5, the colloid 5 in the present embodiment preferably has a plurality of structural features described in the next paragraph, but the present disclosure is not limited thereto. For example, in other embodiments of the present disclosure not shown in the drawings, the sensor package structure 100 can have at least one of the structural features described in the next paragraph, or can have none of the structural features.

In the cross section, any two of the acute angles α1, α2, α3, or α4 have a difference less than or equal to 8 degrees, and any two of the acute angles α1, α2, α3, or α4 (e.g., the acute angle α1 and the acute angle α2) adjacent to each other have a difference that is less than or equal to 3 degrees or that is within a range from 1 degree to 5 degrees. In the cross section, the top curved surface 521 is in an arced shape and has a radius R that is within a range from 0.69 mm to 1.57 mm, and the radius R of the top curved surface 521 in the present embodiment corresponds in position to the reference point P. In the cross section, a shortest distance Dmin between the top curved surface 521 and any one of the wires 3 is within a range from 103 μm to 184 μm, and a smallest distance Dthin between the top curved surface 521 and any one of the first pads 112 is within a range from 230 μm to 305 μm. However, a specific value of any one of the above structural features of the sensor package structure 100 is not limited thereto.

It should be noted that the colloid 5 in the present disclosure can have a single-piece structure or a structure including a plurality of pieces. In the present embodiment, the colloid 5 includes a supporting body 51 and a package body 52, and the package body 52 is a solidified liquid compound, but the present disclosure is not limited thereto.

The supporting body 51 is disposed on the carrying region 212 of the sensor chip 2, and is connected to the bottom surface 42 of the light-permeable layer 4; that is to say, the supporting body 51 is sandwiched between the upper surface 21 of the sensor chip 2 and the bottom surface 42 of the light permeable layer 4. Moreover, the supporting body 51 is arranged around an outer side of the sensing region 211, so that the upper surface 21 of the sensor chip 2, the bottom surface 42 of the light permeable layer 4, and the supporting body 51 jointly define an enclosed space E. The sensing region 211 is arranged in the enclosed space E.

The package body 52 covers the lateral surfaces 43 of the light-permeable layer 4 and has the top curved surface 521. Moreover, the peripheral portion of the sensor chip 2 and the supporting body 51 are embedded in the package body 52, a portion of each of the wires 3 is embedded in the supporting body 51, and a residual portion of each of the wires 3 is embedded in the package body 52.

Second Embodiment

Figure 4:
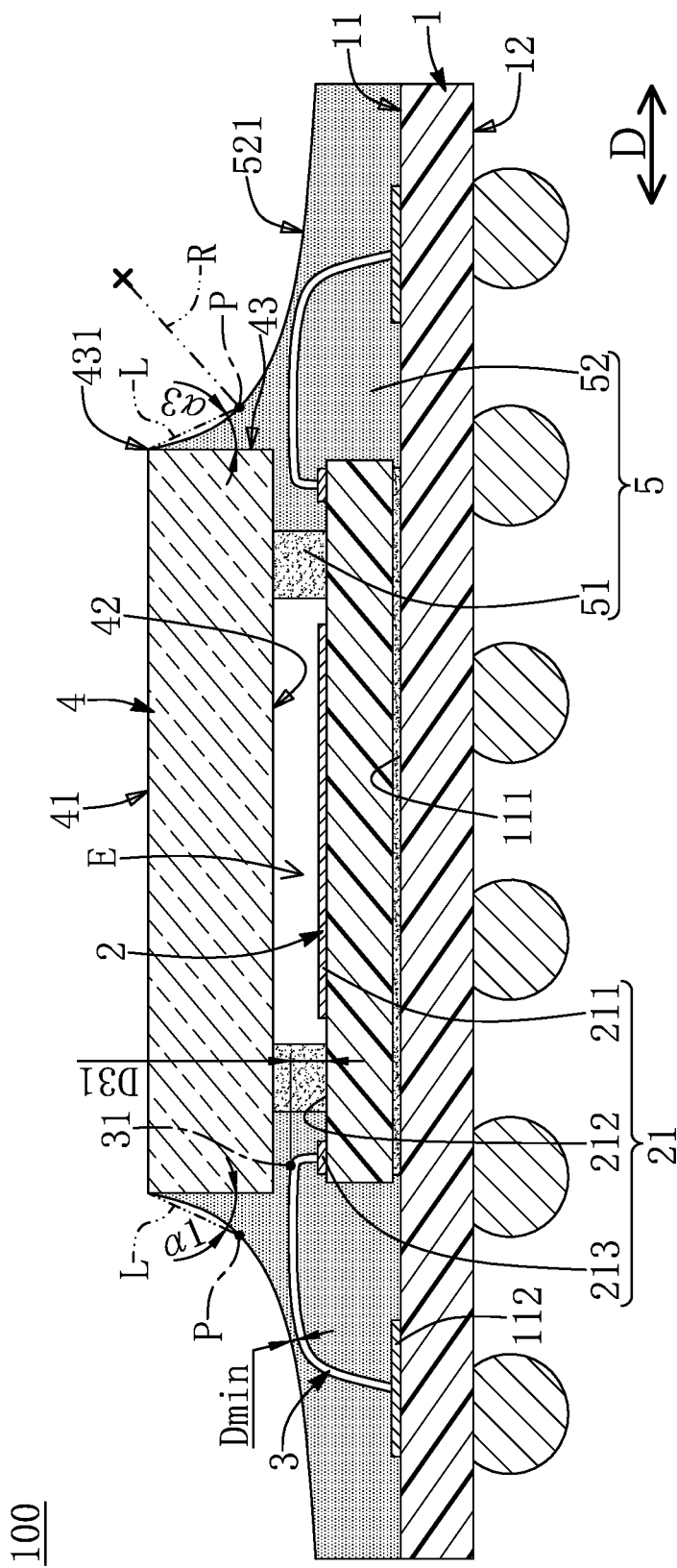
FIG. 4 is a cross-sectional view of the sensor package structure according to a second embodiment of the present disclosure.

Referring to FIG. 4, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the second pads 213 are arranged outside of the supporting body 51, and each of the wires 3 is entirely embedded in the package body 52. According to the first embodiment and the second embodiment of the present disclosure, each of the wires 3 can be at least partially embedded in the package body 52.

Beneficial Effects of the Embodiments

In conclusion, the sensor package structure in the present disclosure is provided by controlling a structural configuration between the top curved surface of the colloid and the light-permeable layer (e.g., the top curved surface of the colloid is partially arranged in the space defined by virtually extending the lateral surfaces of the light-permeable layer along the distribution direction parallel to the substrate, and the acute angle between the connection line and the one of the lateral surfaces is within a range from 25 degrees to 36 degrees), so that the volume of the colloid arranged beside the light-permeable layer can be effectively controlled, the light-permeable layer of the sensor package structure can be firmly fixed by the colloid, and the effect on the light-permeable layer resulting from thermal expansion and contraction of the colloid can be effectively reduced. Accordingly, the light-permeable layer of the sensor package structure in the present disclosure does not easily crack as a result of the thermal expansion and contraction of the colloid.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate having a first surface and a second surface that is opposite to the first surface;
a sensor chip disposed on the first surface of the substrate;
a plurality of wires electrically coupled to the sensor chip and the substrate, wherein two ends of each of the wires are respectively connected to the first surface of the substrate and an upper surface of the sensor chip;
a light-permeable layer arranged above the sensor chip and having a top surface, a bottom surface, and a plurality of lateral surfaces that are connected to the top surface and the bottom surface, wherein the bottom surface of the light-permeable layer faces toward the upper surface of the sensor chip; and
a colloid formed on the first surface of the substrate to fix the light-permeable layer, wherein the wires and a peripheral portion of the sensor chip are embedded in the colloid, the lateral surfaces of the light-permeable layer are covered by the colloid, and the top surface of the light-permeable layer is exposed from the colloid, and wherein an upper portion of a top curved surface of the colloid is arranged in a space defined by virtually extending the lateral surfaces of the light-permeable layer along a distribution direction parallel to the substrate, and another portion of the top curved surface other than the upper portion is arranged outside of the space;
wherein, in a cross section of the sensor package structure perpendicular to the distribution direction, the top curved surface has a reference point spaced apart from one of the lateral surfaces adjacent thereto by 100 µm, a top edge of the top curved surface and the reference point jointly define a connection line, and the connection line and the one of the lateral surfaces have an acute angle there-between that is within a range from 25 degrees to 36 degrees.

2. The sensor package structure according to claim 1, wherein each of the lateral surfaces has an edge connected to the top surface of the light-permeable layer, and the top edge of the top curved surface is connected to the edges of the lateral surfaces.

3. The sensor package structure according to claim 1, wherein in the cross section, the top curved surface is in an arced shape and has a radius that is within a range from 0.69 mm to 1.57 mm.

4. The sensor package structure according to claim 1, wherein an area of the upper portion of the top curved surface is 72% to 95% of an area of an entirety of the top curved surface.

5. The sensor package structure according to claim 1, wherein a shortest distance between the top curved surface and any one of the wires is within a range from 103 µm to 184 µm.

6. The sensor package structure according to claim 1, wherein the colloid includes:
a supporting body sandwiched between the upper surface of the sensor chip and the bottom surface of the light-permeable layer, wherein the upper surface of the sensor chip, the bottom surface of the light-permeable layer, and the supporting body jointly define an enclosed space, and a sensing region of the sensor chip is arranged in the enclosed space; and
a package body covering the lateral surfaces of the light-permeable layer and having the top curved surface, wherein the peripheral portion of the sensor chip and the supporting body are embedded in the package body.

7. The sensor package structure according to claim 6, wherein the substrate includes a plurality of first pads arranged on the first surface, and the sensor chip includes a plurality of second pads that are arranged on the upper surface and that are arranged outside of the sensing region, and wherein the two ends of each of the wires are respectively connected to one of the first pads and one of the second pads, and each of the wires is at least partially embedded in the package body.

8. The sensor package structure according to claim 7, wherein a smallest distance between the top curved surface and any one of the first pads is within a range from 230 µm to 305 µm.

9. The sensor package structure according to claim 1, wherein each of the wires has a highest point away from the first surface, and the highest point of each of the wires is located directly above the upper surface of the sensor chip.

10. The sensor package structure according to claim 9, wherein the highest point of each of the wires is spaced apart from the upper surface of the sensor chip by a distance that is less than or equal to 80 µm.

* * * * *